US007003060B2

(12) United States Patent
Naka et al.

(10) Patent No.: US 7,003,060 B2
(45) Date of Patent: Feb. 21, 2006

(54) HIGH PRECISION DATA AND CLOCK OUTPUT CIRCUIT

(75) Inventors: Naoaki Naka, Kawasaki (JP); Junko Nakamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 820 days.

(21) Appl. No.: 10/095,945

(22) Filed: Mar. 13, 2002

(65) Prior Publication Data

US 2002/0186801 A1 Dec. 12, 2002

(30) Foreign Application Priority Data

Jun. 12, 2001 (JP) .............................. 2001-177454

(51) Int. Cl.
  *H04L 7/00* (2006.01)
(52) U.S. Cl. ...................... 375/354; 375/343; 375/354; 327/141; 370/304
(58) Field of Classification Search ................ 375/343, 375/354, 359; 327/141; 370/304
See application file for complete search history.

(56) References Cited

U.S. PATENT DOCUMENTS

| 4,904,948 | A | * | 2/1990 | Asami ......................... 327/12 |
| 5,602,878 | A | * | 2/1997 | Cross .......................... 375/354 |
| 5,883,529 | A | * | 3/1999 | Kumata et al. ............... 326/93 |
| 6,377,092 | B1 | * | 4/2002 | Ikeda .......................... 327/158 |

FOREIGN PATENT DOCUMENTS

JP  63-254823  10/1988

* cited by examiner

*Primary Examiner*—Kevin Burd
*Assistant Examiner*—Juan Alberto Torres
(74) *Attorney, Agent, or Firm*—Arent Fox PLLC (57) ABSTRACT

An output circuit of the present invention includes a data output circuit and a clock output circuit. The output circuit includes a first D-type flip-flop and a selector for selectively outputting an output from the first D-type flip-flop or second data according to a selection signal. The clock output circuit includes a second D-type flip-flop, a third D-type flip-flop, and a dummy selector circuit. The dummy selector circuit is connected to the second and third D-type flip-flops and outputs a clock signal by using the same elements as those of the selector in order to realize the same delay time as that of the selector.

14 Claims, 8 Drawing Sheets

HIGH PRECISION DATA AND CLOCK OUTPUT CIRCUIT

CROSS-REFERENCE TO RELATED APPLICATIONS

This application is based upon and claims priority of Japanese Patent Application No. 2001-177454, filed on Jun. 12, 2001, the contents being incorporated herein by reference.

BACKGROUND OF THE INVENTION

1. Field of the Invention

The present invention relates to an output circuit for outputting data and a clock.

2. Description of the Related Art

Figure 8A:
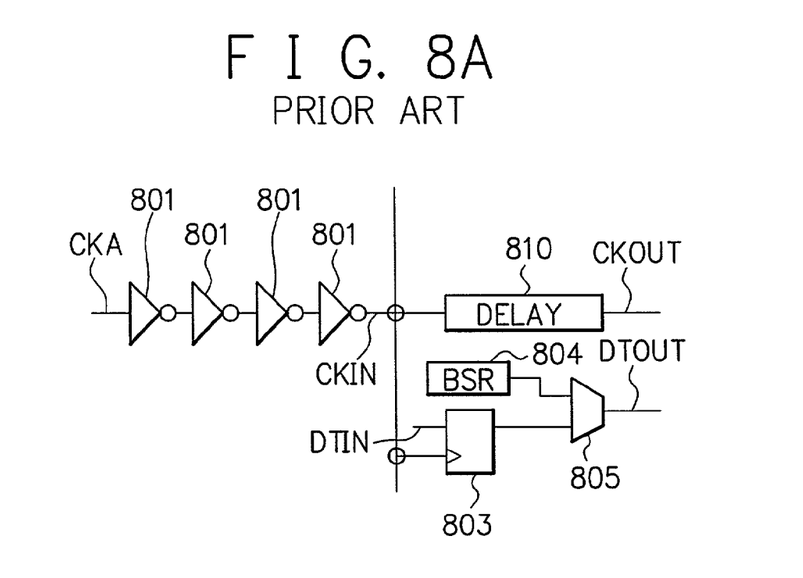
FIG. 8A to FIG. 8C are circuit diagrams of a data and clock output circuit in a prior art.

FIG. 8A shows an output circuit for outputting data and a clock in a prior art. A clock signal CKA is propagated via a plurality of buffers 801. A clock signal CKIN is an output from the buffers 801.

A D-type flip-flop (hereinafter referred to as flip-flop) 803 outputs data DTIN to a selector 805 in synchronization with the clock signal CKIN. The selector 805 selectively outputs either an output from the flip-flop 803 or an output from a BSR (Boundary SCAN register) 804 as output data DTOUT. Although this example is a case of outputting 1-bit output data DTOUT, if plural bits of the output data DTOUT are outputted, plural sets of the flip-flop 803, BSR 804, and selector 805 are connected in parallel.

A delay circuit 810 outputs a clock signal CKOUT by delaying the clock signal CKIN for predetermined time in order to output the data DTOUT and the clock signal CKOUT simultaneously. This delay time needs to be the same as delay time of the flip-flop 803 and the selector 805.

Figure 8B:
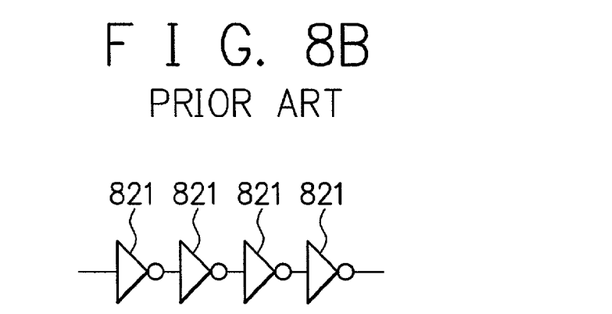

FIG. 8B shows a concrete configuration of the delay circuit 810. The delay circuit 810 is configured by connecting an even number of inverters 821 in series.

Figure 8C:
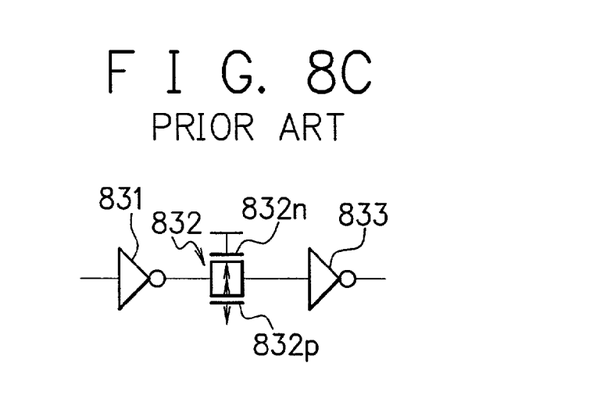

FIG. 8C shows another concrete configuration of the delay circuit 810. The delay circuit 810 is configured by connecting an even number of inverters 831 and 833 and a transfer gate 832 in series. The transfer gate 832 is composed of an n-channel MOS (metal-oxide-semiconductor) transistor 832n and a p-channel MOS transistor 832p. A gate of the n-channel MOS transistor 832n is maintained at the high level and a gate of the p-channel MOS transistor 832p is maintained at the low level. Accordingly, the transistors 832n and 832p turn on together and become equal to a delay element composed of their on-resistance and capacity.

When the data and the clock are outputted simultaneously, the flip-flop 803 is provided in a path of the data while a flip-flop is not provided in a path of the clock, in general. Further, the delay circuit 810 having the same delay time as that of the flip-flop 803 and selector 805 needs to be added into the path of the clock.

However, the flip-flop 803 is a circuit system which outputs the data in synchronization with either the rise or the fall of the clock signal CKIN while the delay circuit 810 is composed of the inverters 821 or the transfer gate 832. Therefore, it is difficult to set the delay time of the delay circuit 810 as the same delay time as that of the flip-flop 803 and selector 805.

Moreover, when the clock signal CKA is propagated in a semiconductor, the duty is deteriorated depending on process variations of the semiconductor and the magnitude of a load to be driven in some cases. Particularly, when a CMOS circuit is used, characteristics of a p-channel MOS transistor and an n-channel MOS transistor are different from each other and the deterioration of the duty because of the process variations of the semiconductor cannot be prevented.

SUMMARY OF THE INVENTION

An object of the present invention is to provide an output circuit capable of simultaneously outputting data and a clock with high precision.

Another object of the present invention is to provide an output circuit capable of simultaneously outputting data and a clock while preventing deterioration of a duty characteristic.

The output circuit of the present invention comprises: a data output circuit; and a clock output circuit. The data output circuit includes a first D-type flip-flop having a data input terminal to which a first data line for inputting first data is connected and a data output terminal from which a state according to the first data is outputted in synchronization with rise or fall of a clock signal, and a selector having a selector output terminal from which an output from the first D-type flip-flop or second data is outputted selectively according to a selection signal. The clock output circuit includes a second D-type flip-flop having a data input terminal to which its own negative logic data output terminal is connected and a positive logic data output terminal and a negative logic data output terminal from which positive logic data and negative logic data of data which has been inputted to the data input terminal are respectively outputted in synchronization with the rise of the clock signal, a third D-type flip-flop having a data input terminal to which its own negative logic data output terminal is connected and a positive logic data output terminal and a negative logic data output terminal from which positive logic data and negative logic data of data which has been inputted to the data input terminal are respectively outputted in synchronization with the fall of the clock signal, and a dummy selector circuit connected to the positive logic and negative logic data output terminals of the second and third D-type flip-flops and having a clock output terminal from which a clock signal is outputted by using the same elements as those of the selector in order to realize the same delay time as that of the selector.

The data output circuit includes the first D-type flip-flop and the selector. The clock output circuit includes the second and third D-type flip-flops and the dummy selector circuit. The second and third D-type flip-flops of the clock output circuit correspond to the first D-type flip-flop of the data output circuit. The dummy selector circuit of the clock output circuit corresponds to the selector of the data output circuit. The configurations of the data output circuit and the clock output circuit are equal to each other and hence the output circuit can simultaneously output the data and the clock with high precision.

DETAILED DESCRIPTION OF THE PREFERRED EMBODIMENTS

Figure 1:
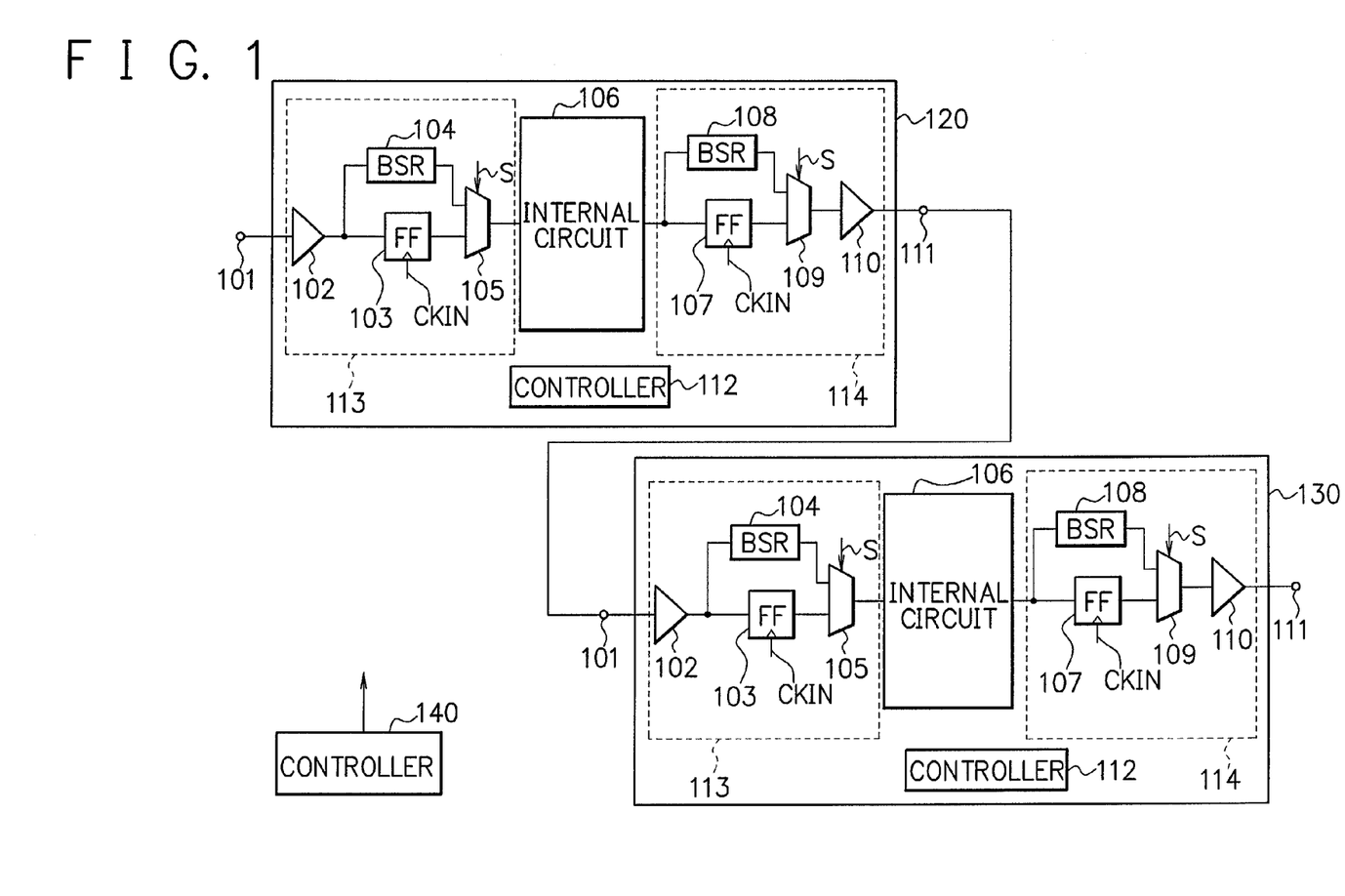
FIG. 1 is a circuit diagram for explaining a SCAN test according to an embodiment of the present invention.

FIG. 1 is a diagram for explaining a method of a SCAN test for a circuit including LSIs (large scale integration) 120 and 130 according to an embodiment of the present invention. Each of the LSIs 120 and 130 includes an input terminal 101, an output terminal 111, and an internal circuit 106 as well as an input section 113, an output section 114, and a controller 112. The output terminal 111 of the LSI 120 is connected to, for example, the input terminal 101 of the LSI 130. A controller 140 controls the controllers 112 in the LSIs 120 and 130.

First of all, a configuration of the input section 113 will be explained. An input of an input buffer 102 is connected to the input terminal 101 and an output thereof is connected to an input of a D-type flip-flop (hereinafter referred to as flip-flop) 103 and an input of a BSR (Boundary SCAN register) 104. The flip-flop 103 has a data input terminal connected to the output of the input buffer 102, a clock input terminal connected to a line of a clock signal CKIN, and an output terminal connected to a selector 105. The BSR 104 is a register whose data is read and written by the controller 112 and has an input terminal connected to the output of the input buffer 102 and an output terminal connected to the selector 105. The selector 105 has a control terminal connected to a line of a selection signal S, a first input terminal connected to the output of the flip-flop 103, a second input terminal connected to the output of the BSR 104, and an output terminal connected to the internal circuit 106.

Next, a configuration of the output section 114 will be explained. A BSR 108 has an input terminal connected to the internal circuit 106 and an output terminal connected to a selector 109. A flip-flop 107 has a data input terminal connected to the internal circuit 106, a clock input terminal connected to the line of the clock signal CKIN, and an output terminal connected to the selector 109. The selector 109 has a control terminal connected to the line of the selection signal S, a first input terminal connected to the output of the flip-flop 107, a second input terminal connected to the output of the BSR 108, and an output terminal connected to an input of an output buffer 110. The output terminal 111 is connected to an output of the output buffer 110.

As the operation of the LSIs 120 and 130, there are the regular operation, the internal test operation, and the external test operation.

First, the regular operation will be explained. Data inputted from the input terminal 101 is inputted to the internal circuit 106 via the input buffer 102, the flip-flop 103, and the selector 105. At this time, the flip-flop 103 outputs input data in synchronization with the clock signal CKIN. The selector 105 selects output data from the flip-flop 103 according to the selection signal S and outputs it. The internal circuit 106 performs predetermined processing. An output from the internal circuit 106 is outputted from the output terminal 111 via the flip-flop 107, the selector 109, and the output buffer 110 in the same way.

The internal test operation will be next explained. The controller 112 writes predetermined test data into the BSR 104. The selector 105 selects an output from the BSR 104 according to the selection signal S and outputs it to the internal circuit 106. An output from the internal circuit 106 is stored in the BSR 108. The controller 112 reads data in the BSR 108 so that whether or not the internal circuit 106 is normal can be tested.

Subsequently, the external test operation will be explained. In the LSI 120, the controller 112 writes predetermined test data into the BSR 108 and the selector 109 selects an output from the BSR 108 according to the selection signal S and outputs it to the output terminal 111 via the output buffer 110. Data outputted from the output terminal 111 of the LSI 120 is inputted to the input terminal 101 of the LSI 130. In the LSI 130, the data inputted to the input terminal 101 is stored in the BSR 104 via the input buffer 102, and the controller 112 reads the data in the BSR 104 so that whether or not a circuit between the LSIs 120 and 130 is normal can be tested.

Figure 2:
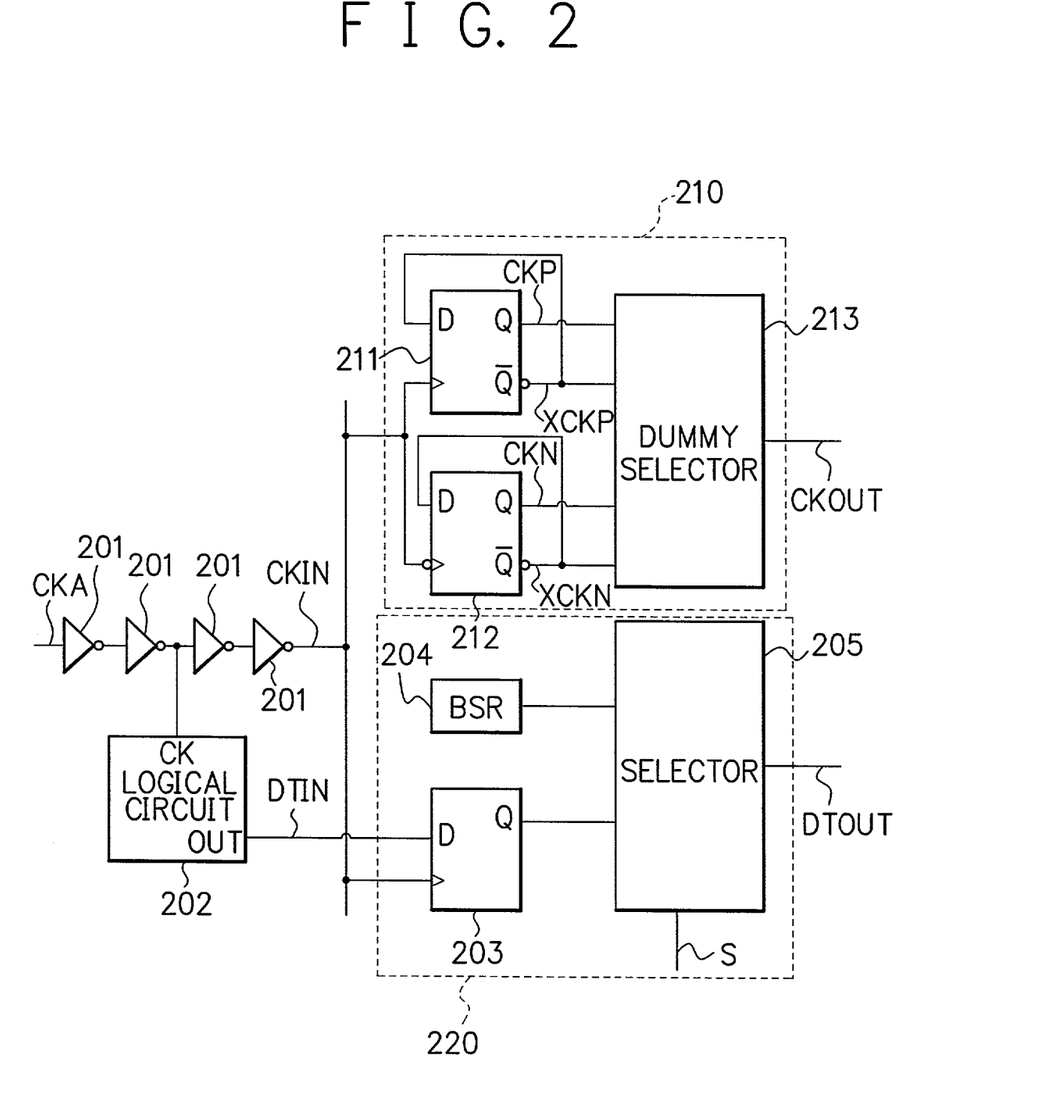
FIG. 2 is a circuit diagram showing an output circuit including a data output circuit and a clock output circuit according to the embodiment.

FIG. 2 shows an output circuit of data and a clock according to the embodiment. This output circuit has a data output circuit 220 and a clock output circuit 210 and is capable of outputting data DTOUT and a clock signal CKOUT simultaneously. The data output circuit 220 includes a flip-flop 203, a BSR 204, and a selector 205, which correspond to the flip-flops 103 and 107, the BSRs 104 and 108, and the selectors 105 and 109 in FIG. 1. In other words, this output circuit is the circuit in the LSI 120 or 130 in FIG. 1.

A clock signal CKA is propagated via an even number of CMOS inverters (buffer) 201. The clock signal CKIN is an output from the plural buffers 201. A logical circuit 202 outputs data DTIN in synchronization with a clock signal, which is the clock signal CKA propagated via the buffers 201, or the clock signal CKA.

The data output circuit 220 will be first explained. The data output circuit 220 includes the flip-flop 203, the BSR 204, and the selector 205. The flip-flop 203 has a data input terminal D connected to a data line for inputting the data DTIN and a clock input terminal connected to a line of the clock signal CKIN and outputs positive logic data of the data DTIN from its data output terminal Q in synchronization with the rise (or the fall) of the clock signal CKIN. The BSR 204 can output test data. The selector 205 selectively outputs the output from the flip-flop 203 or the output from the BSR 204 as the output data DTOUT according to the selection signal S.

Next, the clock output circuit (delay circuit) 210 includes flip-flops 211 and 212, and a dummy selector circuit 213. The flip-flop 211 has a data input terminal D connected to its own negative logic data output terminal /Q and a clock input terminal connected to the line of the clock signal CKIN and outputs positive logic data (positive logic clock) CKP and negative logic data (negative logic clock) XCKP of data inputted to the data input terminal D, from its positive logic data output terminal Q and negative logic data output terminal /Q respectively in synchronization with the rise of the clock signal CKIN.

The flip-flop 212 has a data input terminal D connected to its own negative logic data output terminal /Q and a clock input terminal connected to the line of the clock signal CKIN, and outputs positive logic data (positive logic clock) CKN and negative logic data (negative logic clock) XCKN of data inputted to the data input terminal D, from its positive logic data output terminal Q and negative logic data output terminal /Q respectively in synchronization with the fall of the clock signal CKIN.

The dummy selector circuit 213 is connected to the positive logic output terminal Q and the negative logic output terminal /Q of the flip-flop 211 and the positive logic output terminal Q and the negative logic output terminal /Q of the flip-flop 212, and outputs the clock signal CKOUT by using the same elements as those of the selector 205 in order to realize the same delay time as that of the selector 205. The dummy selector circuit 213 has a function of a delay circuit and outputs the clock signal CKOUT by delaying the clock signal CKIN for predetermined time.

The flip-flops 211 and 212 of the clock output circuit 210 correspond to the flip-flop 203 of the data output circuit 220. The dummy selector circuit 213 of the clock output circuit 210 corresponds to the selector 205 of the data output circuit 220. Since the circuit configurations of the data output circuit 220 and the clock output circuit 210 are equal to each other, this output circuit can output the data DTOUT and the clock signal CKOUT simultaneously with high precision. In other words, the delay time of the clock output circuit 210 can be made to be the same as the delay time of the data output circuit 220 with high precision.

Incidentally, though a case of outputting 1-bit data DTOUT is shown in FIG. 2, when plural bits of the data DTOUT are outputted, a plurality of the data output circuits 220 can be connected in parallel.

Figure 3:
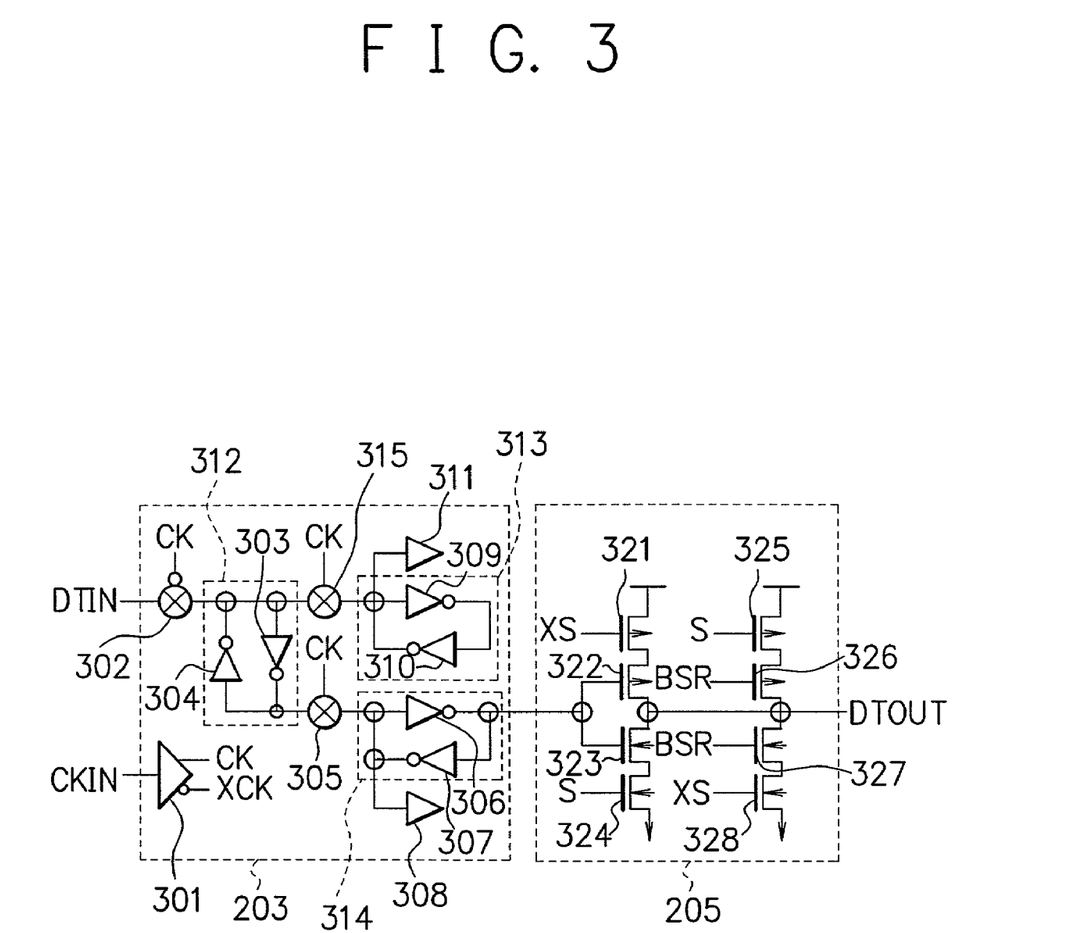
FIG. 3 is a circuit diagram showing the data output circuit.

FIG. 3 shows concrete circuits of the flip-flop 203 and the selector 205 in the data output circuit 220 in FIG. 2.

The configuration of the flip-flop 203 will first be explained. A differential buffer 301 receives the clock signal CKIN and outputs its differential clock signals CK and XCK. The clock signal CK is a positive logic clock signal and the clock signal XCK is a negative logic clock signal with respect to the clock signal CKIN.

A switching element 302, which receives the data DTIN, turns on when the clock signal CK is at the low level and turns off when the clock signal CK is at the high level. An output of the switching element 302 is connected to an input of an inverter 303 and an output of an inverter 304. An output of the inverter 303 and an input of the inverter 304 are connected to an input of a switching element 305. The inverters 303 and 304 compose a master latch 312. The master latch 312 is a holding circuit which holds output data from the switching element 302.

The switching element 305, which receives output data from the inverter 303, turns on when the clock signal CK is at the high level and turns off when the clock signal CK is at the low level. An output of the switching element 305 is connected to an input of an inverter 306, an output of an inverter 307, and an input of a buffer 308. An output of the inverter 306 and an input of the inverter 307 are connected to the output terminal Q of the flip-flop 203. The inverters 306 and 307 compose a first slave latch 314. The first slave latch 314 is a holding circuit which holds output data from the switching element 305. Incidentally, the buffer 308 is provided corresponding to buffers 308 in flip-flops 211 and 212 in a clock output circuit which will be shown in FIG. 4.

A switching element 315, which receives output data from the inverter 304, turns on when the clock signal CK is at the high level and turns off when the clock signal CK is at the low level. An output of the switching element 315 is connected to an input of an inverter 309, an output of an inverter 310, and an input of a buffer 311. An output of the inverter 309 and an input of the inverter 310 are connected to each other. The inverters 309 and 310 compose a second slave latch 313. The second slave latch 313 is a holding circuit which holds output data from the switching element 315. The second slave latch 313 and the buffer 311 are provided corresponding to the first slave latch 314 and the buffer 308, and further to second slave latches 313 and buffers 311 in the flip-flops 211 and 212 in the clock output circuit which will be shown in FIG. 4.

Next, the operation of the flip-flop 203 will be explained. The switching element 302 turns on when the clock signal CK falls and the data DTIN is held in the master latch 312. The inverter 303 outputs negative logic data of the data DTIN. Subsequently, when the clock signal CK rises, the switching element 305 turns on. The inverter 306 outputs the positive logic data of the data DTIN. This output becomes the output from the output terminal Q of the flip-flop 203.

A configuration of the selector 205 will be next explained. The output terminal Q of the flip-flop 203 is connected to gates of a p-channel MOS transistor 322 and an n-channel MOS transistor 323. A gate of a p-channel MOS transistor 321 is connected to a line of a negative logic signal XS of the selection signal S. A gate of an n-channel MOS transistor 324 is connected to a line of a positive logic signal S of the selection signal S. The series connection of the p-channel MOS transistors 321 and 322 is connected between a first voltage source, which generates a first potential, and an output terminal of the output data DTOUT. The series connection of the n-channel MOS transistors 323 and 324 is connected between the output terminal of the output data DTOUT and a second voltage source, which generates a second potential. The first potential is higher than the second potential.

A gate of a p-channel MOS transistor 325 is connected to the line of the positive logic signal S of the selection signal S. A gate of a p-channel MOS transistor 326 is connected to an output of the BSR 204 (FIG. 2). A gate of an n-channel MOS transistor 327 is connected to the output of the BSR 204 (FIG. 2). A gate of an n-channel MOS transistor 328 is connected to the line of the negative logic signal XS of the selection signal S. The series connection of the p-channel MOS transistors 325 and 326 is connected between the above-described first voltage source and the output terminal of the output data DTOUT. The series connection of the n-channel MOS transistors 327 and 328 is connected between the output terminal of the output data DTOUT and the above-described second voltage source.

All of the aforesaid p-channel MOS transistors 321, 322, 325, and 326 are structured to have the same size and all of the aforesaid n-channel MOS transistors 323, 324, 327, and 328 are structured to have the same size.

Subsequently, the operation of the selector 205 will be explained. The selector 205 outputs logic invert data of the output from the flip-flop 203 as the data DTOUT when the selection signal S is turned into the high level, while outputs logic invert data of the output from the BSR 204 (FIG. 2) as the data DTOUT when the selection signal is turned into the low level.

First, the case in which the selection signal S is the high level will be explained in detail. When the selection signal S is turned into the high level, the p-channel MOS transistor 321 turns on and the n-channel MOS transistor 324 also turns on. Then, due to the action of a CMOS inverter composed of the p-channel MOS transistor 322 and the n-channel MOS transistor 323, the logic invert data of the output from the flip-flop 203 is outputted as the data DTOUT. At this time, the transistors 325 and 328 turn off.

Next, the case in which the selection signal S is at the low level will be explained in detail. When the selection signal S is turned into the low level, the p-channel MOS transistor 325 and the n-channel MOS transistor 328 turn on. Then, due to the action of a CMOS inverter composed of the p-channel MOS transistor 326 and the n-channel MOS transistor 327, the logic invert data of the output from the BSR 204 (FIG. 2) is outputted as the data DTOUT. At this time, the transistors 321 and 324 turn off.

Figure 4:
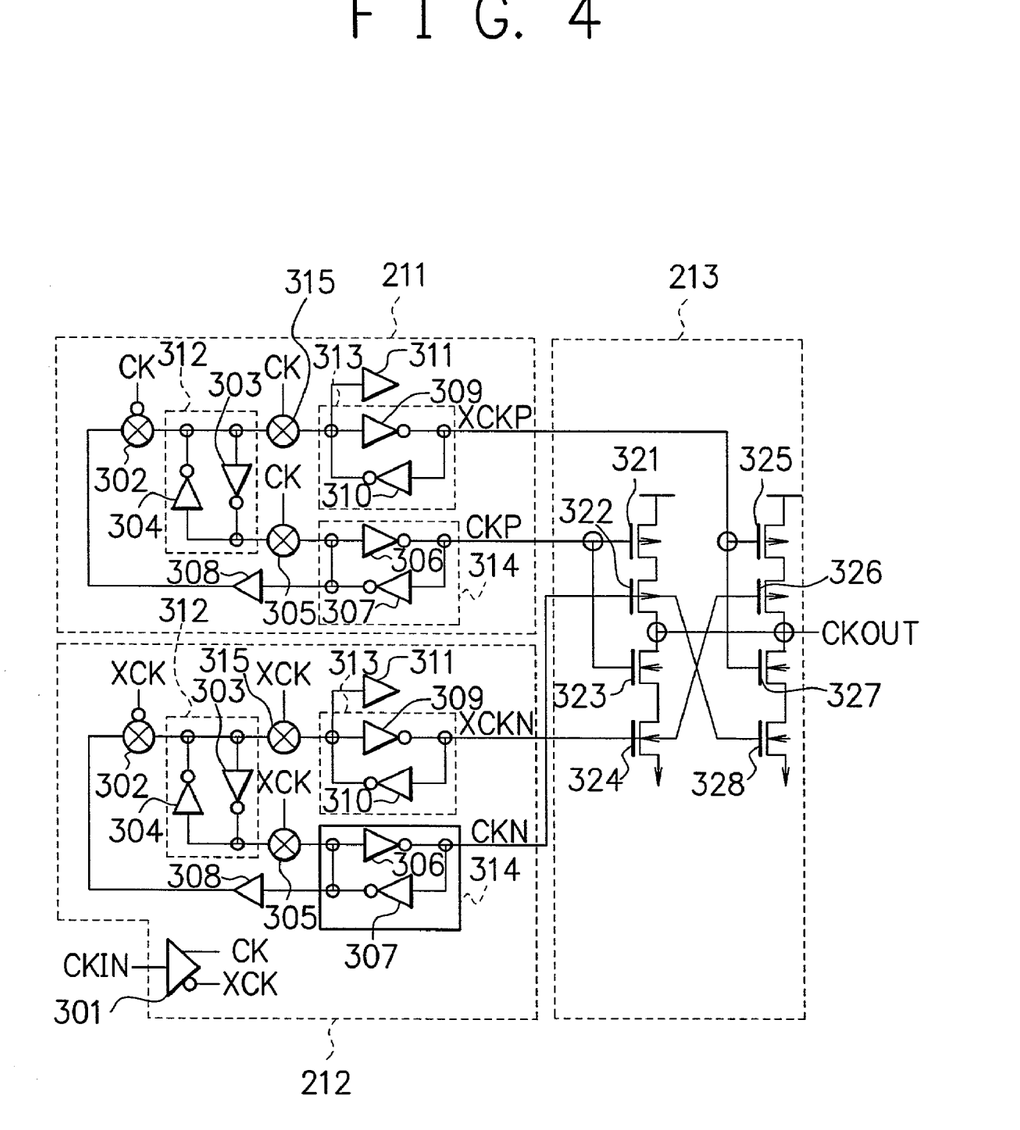
FIG. 4 is a circuit diagram showing the clock output circuit.

FIG. 4 shows concrete circuits of the flip-flops 211 and 212 and dummy selector circuit 213 in the clock output circuit 210 in FIG. 2.

First, a configuration of the flip-flop 211 will be explained. Since the flip-flop 211 is basically the same as the flop-flop 203 in FIG. 3, only the different part will be explained. To an input of the switching element 302, an output of the buffer 308 is connected in place of the data DTIN. The output of the inverter 306 is connected to the positive logic output terminal Q (FIG. 2) for outputting the positive logic clock CKP. An output of the inverter 309 is connected to the negative logic output terminal /Q (FIG. 2) for outputting the negative logic clock XCKP.

Next, a configuration of the flip-flop 212 will be explained. The flip-flop 212 is different from the flip-flop 211 only in that its switching elements 302, 305, and 315 turn on/off in response to the clock signal XCK. Specifically, the switching element 302 turns on when the clock signal XCK is turned into the low level, and turns off when the clock signal XCK is turned into the high level. The switching elements 305 and 315 turn on when the clock signal XCK is turned into the high level, and turn off when the clock signal XCK is turned into the low level. The output of the inverter 306 is connected to the positive logic output terminal Q (FIG. 2) for outputting the positive logic clock CKN. An output of the inverter 309 is connected to the negative logic output terminal /Q (FIG. 2) for outputting the negative logic clock XCKN.

Subsequently, a configuration of the dummy selector circuit 213 will be explained. Since the dummy selector circuit 213 is basically the same as the selector 205 in FIG. 3, only the different part will be explained. The gates of the p-channel MOS transistor 321 and the n-channel MOS transistor 323 are connected to a line of the clock signal CKP. The gates of the p-channel MOS transistor 325 and the n-channel MOS transistor 327 are connected to a line of the clock signal XCKP. The gates of the p-channel MOS transistor 322 and the n-channel MOS transistor 328 are connected to a line of the clock signal CKN. The gates of the p-channel MOS transistor 326 and the n-channel MOS transistor 324 are connected to a line of the clock signal XCKN. The clock CKOUT is outputted from an output terminal.

Figure 5:
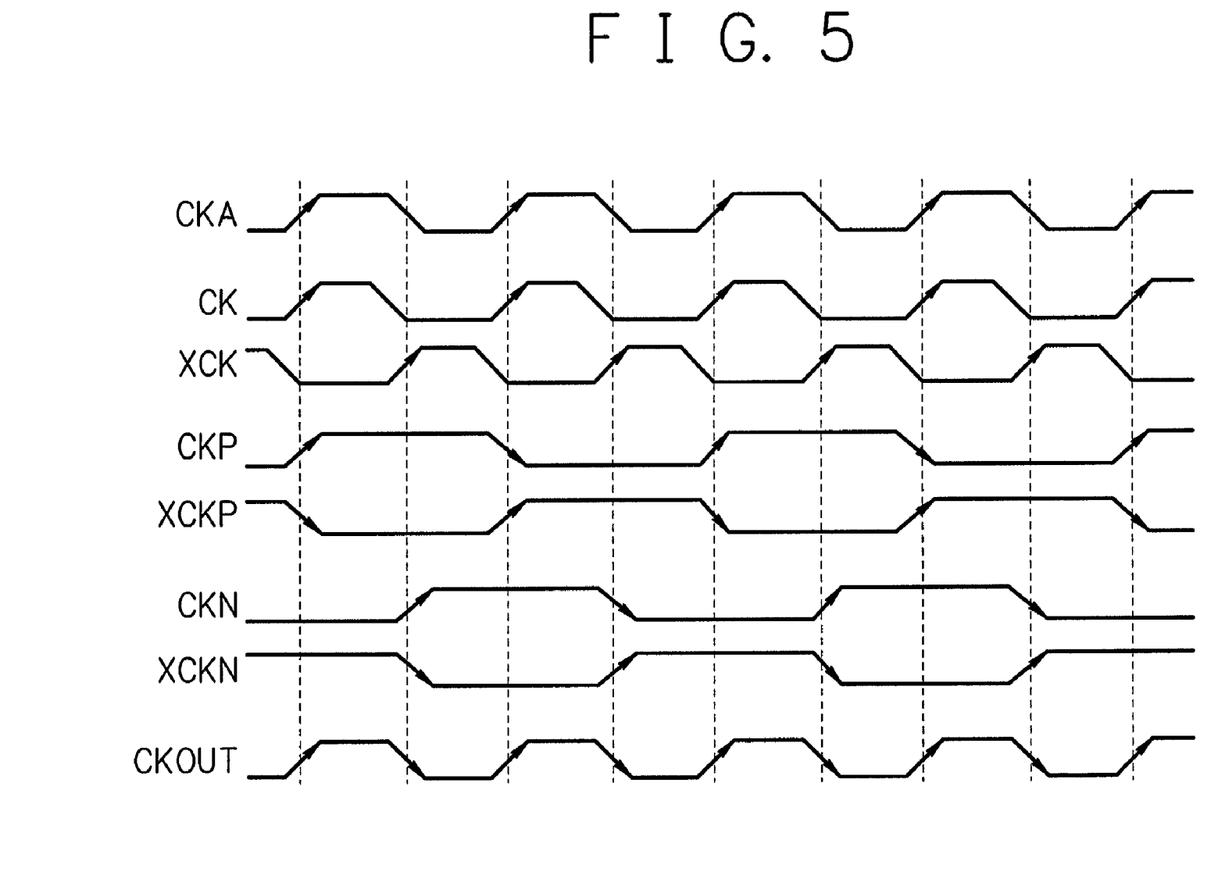
FIG. 5 is a timing chart for explaining the operation of the clock output circuit according to the embodiment.

Referring to FIG. 5, the operation of the flip-flops 211 and 212 and the dummy selector circuit 213 in FIG. 4 will be explained. The clock signal CKA (FIG. 2) is a clock signal before propagation. With respect to the clock signal CKA, the clock signal CK is a positive logic clock signal and the clock signal XCK is a negative logic clock signal.

The operation of the flip-flop 211 will be explained. The switching element 302 receives from the inverter 307 a clock signal, which is the clock signal CKP whose logic is inverted, and turns on when the clock signal CK falls. The inverter 303 outputs a positive logic signal of the clock signal CKP. The switching elements 305 and 315 turn on when the clock signal CK rises. The inverter 306 outputs a negative logic signal of the clock signal CKP as a new clock signal CKP. Meanwhile, the inverter 309 outputs the positive logic signal of the clock signal CKP as the clock signal XCKP. In other words, the clock signal CKP is inverted in synchronization with rising edges of the clock signal CK and has a frequency twice as that of the clock signal CK. Meanwhile, the clock signal XCKP is a logic invert signal of the clock signal CKP.

Similarly, the flip-flop 212 operates in synchronization with the clock signal XCK. Specifically, the clock signal CKN is inverted in response to rising edges of the clock signal XCK and has a frequency twice as that of the clock signal XCK. Meanwhile, the clock signal XCKN is a logic invert signal of the clock signal CKN.

Subsequently, the operation of the dummy selector circuit 213 will be explained. When the clock signal CKP is turned into the high level/low level, the transistor 321 turns off/on and the transistor 323 turns on/off. When the clock signal XCKP is turned into the high level/low level, the transistor 325 turns off/on and the transistor 327 turns on/off. When the clock signal CKN is turned into the high level/low level, the transistor 322 turns off/on and the transistor 328 turns on/off. When the clock signal XCKN is turned into the high level/low level, the transistor 326 turns off/on and the transistor 324 turns on/off. As a result, the clock signal CKOUT becomes a clock signal having the same frequency as that of the clock signal CKIN and being the clock signal CKIN which has been delayed for predetermined time.

As described above, the circuit configurations of the data output circuit 220 and the clock output circuit 210 are made to be equal to each other by using the same circuit elements for both of them so that the data DTOUT and the clock signal CKOUT can be simultaneously outputted with high precision.

Next, a duty characteristic of the clock signal will be explained. The duty is expressed by a ratio of the time for the high level to a frequency of a clock signal. Though the preferable duty is 50%, a rising characteristic and a falling characteristic of the clock signal CKIN are different because of the difference in characteristic between p-channel MOS transistors and n-channel MOS transistors in the CMOS inverters 201 in FIG. 2. As a result, the duty characteristic is deteriorated. Therefore, a circuit for preventing the duty characteristic from being deteriorated will be explained below.

Figure 6:
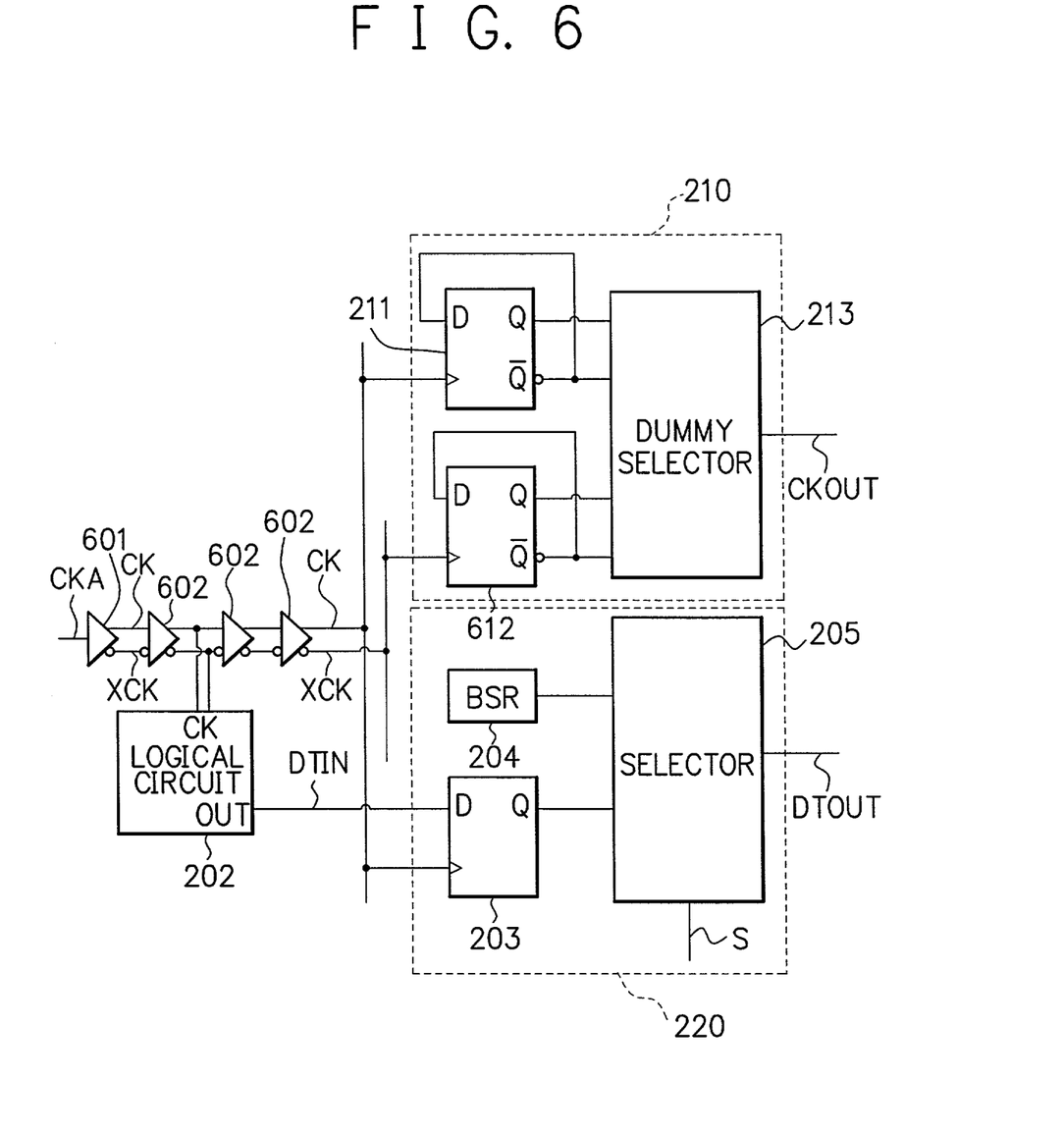
FIG. 6 is a circuit diagram of an output circuit including a data output circuit and a clock output circuit according to another embodiment of the present invention.

FIG. 6 shows an output circuit according to another embodiment of the present invention. The part of this output terminal, which is different from the output terminal in FIG. 2, will be explained. A differential buffer 601 outputs differential clock signals CK and XCK based on the clock signal CKA. With respect to the clock signal CKA, the clock signal CK is a positive logic signal and the clock signal XCK is a negative logic signal. The clock signals CK and XCK are propagated via a plurality of buffers 602.

The clock output circuit 210 includes a flip-flop 612 in place of the flop-flop 212 in FIG. 2. The flip-flop 612 has a clock input terminal connected to a line of the clock signal XCK and outputs in synchronization with the rise of the clock signal XCK. In other words, all of three flip-flops 211, 612, and 203 outputs in synchronization with the rise of the clock signal. Here, the clock input terminals of the flip-flops 211 and 203 are connected to a line of the clock signal CK.

Referring to FIG. 5, the reason why the duty characteristic is improved will be explained. Even if the duty characteristic of the clock signal CKA is excellent, the duty characteristics of the clock signals CK and XCK become deteriorated under the influence of the buffers 602. Actually, different from FIG. 5, since the clock signal XCK is the clock signal CK whose logic is inverted, the duty characteristic of the clock signal CKOUT is deteriorated in the output circuit in FIG. 2.

In the output circuit in FIG. 6, as shown in FIG. 5, the clock signals CK and XCK have the same rising characteristic and falling characteristic although their duty characteristics are deteriorated. Here, an attention is paid on the point that the rising characteristic of the clock signal CK and the rising characteristic of the clock signal XCK are the same. The flip-flop 211 produces the rise of the clock signal CKOUT by using the rise of the clock signal CK. Meanwhile, the flip-flop 612 produces the fall of the clock signal CKOUT by using the rise of the clock signal XCK. The clock signal CKOUT is produced by using the rise of both of the clock signals CK and XCK as described above so that the duty characteristic of the clock signal CKOUT can be made to be excellent. In this case, the differential buffer 301 in FIG. 3 and FIG. 4 becomes unnecessary.

Incidentally, it is also possible to make the duty characteristic excellent in a manner in which all of the flip-flops 211, 612, and 203 output in synchronization with the fall of the clock signals so as to produce the clock signal CKOUT by using only the fall of the clock signals CK and XCK.

Figure 7:
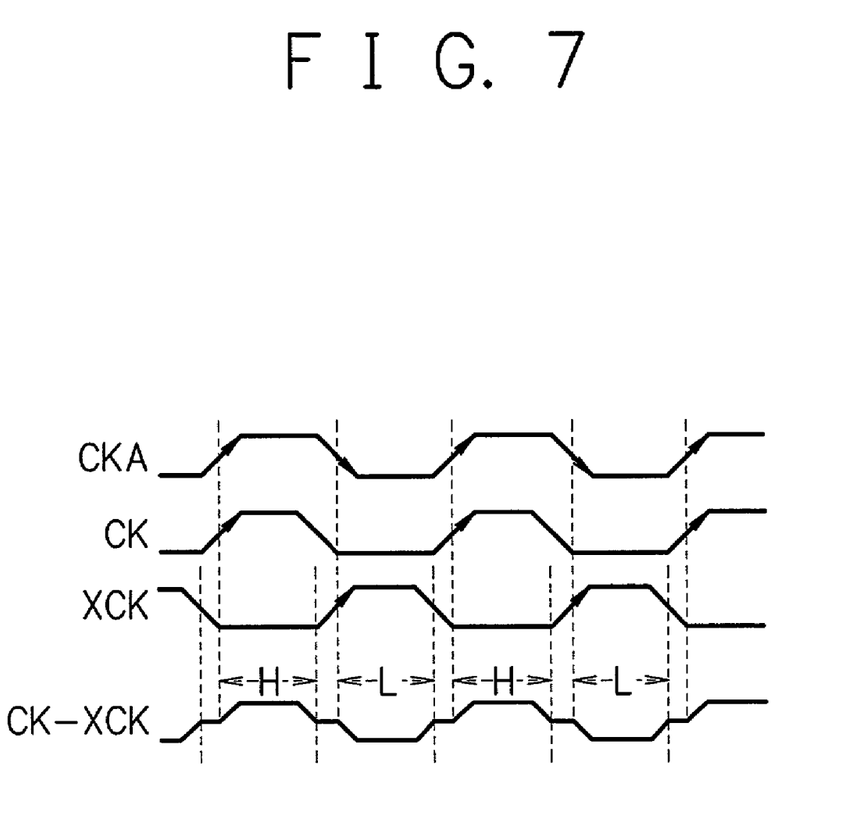
FIG. 7 is a timing chart showing differential signals.

As shown in FIG. 7, when the differential signals CK and XCK of the clock signal CKA are used, it can be considered to use a difference signal CK–XCK between them. However, the difference signal CK–XCK cannot be used for improving the duty characteristic of the clock signal CKOUT. The duty characteristic can be improved by using only the rise or fall of the clock signals CK and XCK, as in this embodiment.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described above, a data output circuit includes a first D-type flip-flop and a selector, and a clock output circuit includes second and third D-type flip-flops and a dummy selector circuit. The second and third D-type flip-flops of the clock output circuit correspond to the first D-type flip-flop of the data output circuit. The dummy selector circuit of the clock output circuit corresponds to the selector of the data output circuit. Since the circuit configurations of the data output circuit and the clock output circuit are equal to each other, the output circuit can simultaneously outputs data and a clock signal with high precision.

What is claimed is:

1. An output circuit comprises:
a data output circuit; and
a clock output circuit,
wherein the data output circuit includes
a first D-type flip-flop having a data input terminal to which a first data line for inputting first data is connected and a data output terminal from which a state according to the first data is outputted in synchronization with rise or fall of a clock signal, and
a selector having a selector output terminal from which an output from the first D-type flip-flop or second data is outputted selectively according to a selection signal, and
wherein said clock output circuit includes
a second D-type flip-flop having a data input terminal to which its own negative logic data output terminal is connected and a positive logic data output terminal and a negative logic data output terminal from which positive logic data and negative logic data of data which has been inputted to the data input terminal are respectively outputted in synchronization with the rise of the clock signal,
a third D-type flip-flop having a data input terminal to which its own negative logic data output terminal is connected and a positive logic data output terminal and a negative logic data output terminal from which positive logic data and negative logic data of data which has been inputted to the data input terminal are respectively outputted in synchronization with the fall of the clock signal, and
a dummy selector circuit connected to the positive logic and negative logic data output terminals of the second and third D-type flip-flops, and having a clock output terminal from which a clock signal is outputted by using same elements as those of the selector in order to realize same delay time as that of the selector.

2. The output circuit according to claim 1, wherein the first D-type flip-flop outputs data in synchronization with a positive logic clock signal of the clock signal and the second D-type flip-flop outputs data in synchronization with a negative logic clock signal of the clock signal.

3. The output circuit according to claim 1, further comprising:
a clock input node for inputting the clock signal,
wherein the clock input node is connected to clock input terminals of the first, second, and third D-type flip-flops.

4. The output circuit according to claim 2, further comprising:
a differential clock circuit for producing differential clock signals composed of a positive logic clock signal and a negative logic clock signal based on the clock signal and propagating them,
wherein the first D-type flip-flop outputs data in synchronization with the positive logic clock signal and the second D-type flip-flop outputs data in synchronization with the negative logic clock signal.

5. The output circuit according to claim 1,
wherein, in the dummy selector circuit, a first p-channel MOS transistor having a gate connected to the positive logic data output terminal of the second D-type flip-flop and a second p-channel MOS transistor having a gate connected to the positive logic data output terminal of the third D-type flip-flop are connected in series between a first voltage source generating a first potential and a clock output terminal,
a first n-channel MOS transistor having a gate connected to the positive logic data output terminal of the second D-type flip-flop and a second n-channel MOS transistor having a gate connected to the negative logic data output terminal of the third D-type flip-flop are connected in series between a second voltage source generating a second potential and the clock output terminal,
a third p-channel MOS transistor having a gate connected to the negative logic data output terminal of the second D-type flip-flop and a fourth p-channel MOS transistor having a gate connected to the negative logic data output terminal of the third D-type flip-flop are connected in series between the first voltage source and the clock output terminal, and
a third n-channel MOS transistor having a gate connected to the negative logic data output terminal of the second D-type flip-flop and a fourth n-channel MOS transistor having a gate connected to the positive logic data output terminal of the third D-type flip-flop are connected in series between the second voltage source and the clock output terminal, and
wherein, in the selector,
a fifth p-channel MOS transistor having a gate connected to a second data line for inputting the second data and a sixth p-channel MOS transistor having a gate connected to a line of a positive logic signal of the selection signal for switching between an output signal from the first D-type flip-flop and the second data are connected in series between the first voltage source and the selector output terminal, a fifth n-channel MOS transistor having a gate connected to the second data line and a sixth n-channel MOS transistor connected to a line of a negative logic signal of the selection signal are connected in series between the second voltage source and the selector output terminal, a seventh p-channel MOS transistor having a gate connected to a positive logic data output terminal of the first D-type flip-flop and an eighth p-channel MOS transistor having a gate connected to the line of the negative logic signal of the selection signal are connected in series between the first voltage source and the selector output terminal, and a seventh n-channel MOS transistor having a gate connected to the positive logic data output terminal of the first D-type flip-flop and an eighth n-channel MOS transistor having a gate connected to the line of the positive logic signal of the selection signal are connected in series between the second voltage source and the selector output terminal.

6. The output circuit according to claim 5,
wherein the first potential is higher than the second potential.

7. The output terminal according to claim 5,
wherein all of the first to third D-type flip-flops are configured by same circuits,
wherein all of the first to eighth p-channel MOS transistors are structured to have same size, and
wherein all of the first to eighth n-channel MOS transistors are structured to have same size.

8. The output circuit according to claim 1,
wherein each of the first to third D-type flip-flops includes:
a master latch composed of a first switching element turning on/off in response to the clock signal, and a first holding circuit for holding data inputted via the first switching element;
a first slave latch composed of a second switching element connected to a positive logic output of the first holding circuit and turning on at a logic value opposite to that of the first switching element, and a second holding circuit for holding data inputted via the second switching element; and
a second slave latch composed of a third switching element connected to a negative logic output of the first holding circuit and turning on at the logic value opposite to that of the first switching element, and a third holding circuit for holding data inputted via the third switching element.

9. The output circuit according to claim 5,
wherein each of the first to third D-type flip-flops includes:
a master latch composed of a first switching element turning on/off in response to the clock signal, and a first holding circuit for holding data inputted via the first switching element;
a first slave latch composed of a second switching element connected to a positive logic output of the first holding circuit and turning on at a logic value opposite to that of the first switching element, and a second holding circuit for holding data inputted via the second switching element; and
a second slave latch composed of a third switching element connected to a negative logic output of the first holding circuit and turning on at the logic value opposite to that of the first switching element, and a third holding circuit for holding data inputted via the third switching element.

10. The output circuit according to claim 9,
wherein the first potential is higher than the second potential.

11. The output circuit according to claim 9,
wherein all of the first to third D-type flip-flops are configured by same circuits,
wherein all of the first to eight p-channel MOS transistors are structured to have same size, and
wherein all of the first to eight n-channel MOS transistors are structured to have same size.

12. The output circuit according to claim 9,
wherein the first D-type flip-flop outputs data in synchronization with a positive logic clock signal of the clock signal and the second D-type flip-flop outputs data in synchronization with a negative logic clock signal of the clock signal.

13. The output circuit according to claim 9, further comprising:
a clock input node for inputting the clock signal,
wherein the clock input node is connected to clock input terminals of the first, second, and third D-type flip-flops.

14. The output circuit according to claim 12, further comprising:
a differential clock circuit for producing differential clock signals composed of a positive logic clock signal and a negative logic clock signal based on the clock signal and propagating them,
wherein the first D-type flip-flop outputs data in synchronization with the positive logic clock signal and the second D-type flip-flop outputs data in synchronization with the negative logic clock signal.

* * * * *